US009166079B2

(12) United States Patent
Manning

(10) Patent No.: US 9,166,079 B2
(45) Date of Patent: *Oct. 20, 2015

(54) METHOD OF FORMING CONTACTS FOR A BACK-CONTACT SOLAR CELL

(71) Applicant: SunPower Corporation, San Jose, CA (US)

(72) Inventor: Jane Manning, Woodside, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/302,254

(22) Filed: Jun. 11, 2014

(65) Prior Publication Data

US 2014/0295607 A1 Oct. 2, 2014

Related U.S. Application Data

(63) Continuation of application No. 13/930,078, filed on Jun. 28, 2013, now Pat. No. 8,778,787, which is a continuation of application No. 12/959,199, filed on Dec. 2, 2010, now Pat. No. 8,492,253.

(51) Int. Cl.
*H01L 21/22* (2006.01)
*H01L 31/0224* (2006.01)
*H01L 31/068* (2012.01)
(Continued)

(52) U.S. Cl.
CPC .... *H01L 31/022441* (2013.01); *H01L 31/0682* (2013.01); *H01L 31/1864* (2013.01); *H01L 21/225* (2013.01); *H01L 21/2255* (2013.01);
(Continued)

(58) Field of Classification Search
CPC .............. H01L 21/225; H01L 21/2255; H01L 21/2256; H01L 33/1864; H01L 31/022441
USPC ............. 257/461, E21.135, E21.14, E21.468, 257/E25.007, E27.124, E27.125; 438/548, 438/558, 563, 57, 73
See application file for complete search history.

(56) References Cited

U.S. PATENT DOCUMENTS 7,468,485 B1   12/2008   Swanson
7,812,250 B2   10/2010   Smith
(Continued)

FOREIGN PATENT DOCUMENTS

JP   64-047023   2/1989
JP   H04-61321   2/1992
(Continued)

OTHER PUBLICATIONS

International Search Report and Written Opinion from PCT/US2011/054603 mailed Apr. 25, 2012, 10 pgs.
(Continued)

*Primary Examiner* — Kimberly Rizkallah
*Assistant Examiner* — Maria Ligai
(74) *Attorney, Agent, or Firm* — Blakely Sokoloff Taylor Zafman LLP

(57) ABSTRACT

Methods of forming contacts for solar cells are described. In one embodiment, a method includes forming a silicon layer above a substrate, forming and patterning a solid-state p-type dopant source on the silicon layer, forming an n-type dopant source layer over exposed regions of the silicon layer and over a plurality of regions of the solid-state p-type dopant source, and heating the substrate to provide a plurality of n-type doped silicon regions among a plurality of p-type doped silicon regions.

16 Claims, 6 Drawing Sheets

(51) Int. Cl.
*H01L 31/18* (2006.01)
*H01L 21/225* (2006.01)

(52) U.S. Cl.
CPC ............. *H01L 21/2256* (2013.01); *Y02E 10/52* (2013.01); *Y02E 10/547* (2013.01)

(56) References Cited

U.S. PATENT DOCUMENTS

| | | |
|---|---|---|
| 7,820,475 B2 | 10/2010 | De Ceuster et al. |
| 8,492,253 B2 * | 7/2013 | Manning .................. 438/563 |
| 2002/0153039 A1 * | 10/2002 | Moon et al. .................. 136/256 |
| 2006/0060238 A1 | 3/2006 | Hacke et al. |
| 2007/0134655 A1 | 6/2007 | Bentwich |
| 2007/0194636 A1 | 8/2007 | Ohashi |
| 2008/0035198 A1 | 2/2008 | Teppe et al. |
| 2009/0203197 A1 | 8/2009 | Hanawa et al. |
| 2009/0308438 A1 | 12/2009 | De Ceuster et al. |
| 2010/0010493 A1 | 1/2010 | Dower |
| 2010/0126038 A1 | 5/2010 | Dreossi et al. |

FOREIGN PATENT DOCUMENTS

| | | |
|---|---|---|
| JP | H09-8127 | 1/1997 |
| JP | 2008-512858 | 4/2008 |
| WO | WO-2010/025269 | 3/2010 |
| WO | WO-2010/065434 | 6/2010 |

OTHER PUBLICATIONS

International Preliminary Report on Patentability from PCT/US2011/054603 mailed Jun. 13, 2013, 6 pgs.
Non-Final Office Action from U.S. Appl. No. 13/930,078, mailed Nov. 14, 2013, 7 pgs.
Examination Report for Australian Patent Application No. 2011337153, mailed Apr. 9, 2014, 2 pgs.
Notice of Reasons for Rejection from Japanese Patent Application No. 2013-541988 mailed Jun. 2, 2015, 2 pgs.
Kazuo Maeda, "The Latest LSI Process," Kogyo Chosakai Publishing Co., Ltd., Jul. 25, 1983, pp. 156-158.
Notification of the First Office Action from Chinese Patent Application No. 201180032320.X mailed Mar. 17, 2015, 7 pgs.

* cited by examiner

METHOD OF FORMING CONTACTS FOR A BACK-CONTACT SOLAR CELL

CROSS-REFERENCE TO RELATED APPLICATIONS

This application is a continuation of U.S. patent application Ser. No. 13/930,078, filed Jun. 28, 2013, which is a continuation of U.S. patent application Ser. No. 12/959,199, filed Dec. 2, 2010, now U.S. Pat. No. 8,492,253, issued Jul. 23, 2013, the entire contents of which are hereby incorporated by reference herein.

GOVERNMENT LICENSE RIGHTS

The invention described herein was made with Governmental support under contract number DE-FC36-07G017043 awarded by the United States Department of Energy. The Government may have certain rights in the invention.

TECHNICAL FIELD

Embodiments of the present invention are in the field of renewable energy and, in particular, methods of forming contacts for back-contact solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
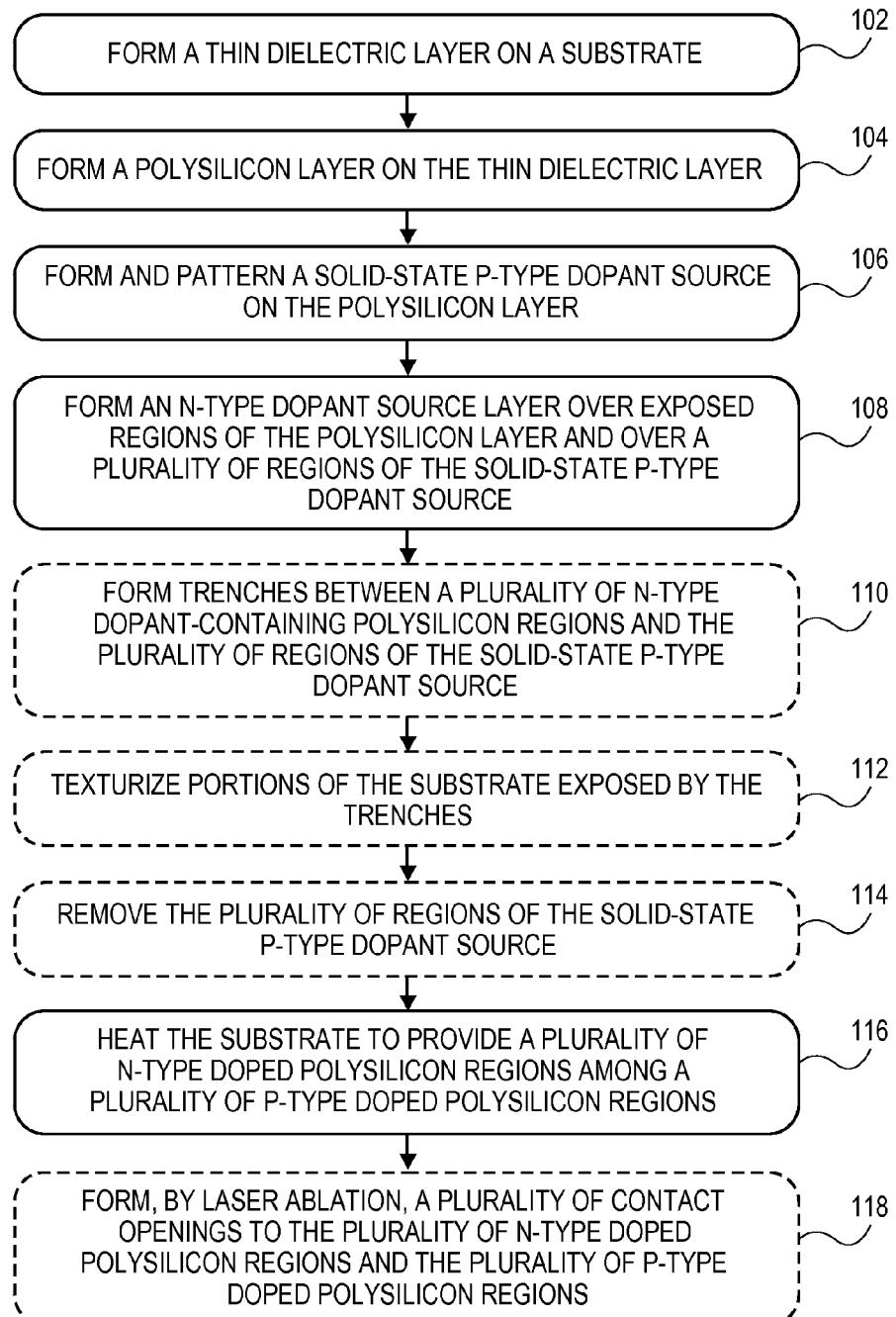
FIG. 1 illustrates a flowchart representing operations in a method of forming contacts for a back-contact solar cell, in accordance with an embodiment of the present invention.

Methods of forming contacts for back-contact solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of forming contacts for back-contact solar cells. In one embodiment, a method includes forming a thin dielectric layer on a substrate. A polysilicon layer is formed on the thin dielectric layer. A solid-state p-type dopant source is formed and patterned on the polysilicon layer. The patterning exposes regions of the polysilicon layer between a plurality of regions of the solid-state p-type dopant source. An n-type dopant source layer is formed over the exposed regions of the polysilicon layer and the plurality of regions of the solid-state p-type dopant source. Forming the n-type dopant source includes at least partially driving dopants from the n-type dopant source layer into the exposed regions of the polysilicon layer to form a plurality of n-type dopant-containing polysilicon regions between the plurality of regions of the solid-state p-type dopant source. The substrate is heated to provide a plurality of n-type doped polysilicon regions among a plurality of p-type doped polysilicon regions.

In another embodiment, a method also includes first forming a thin dielectric layer on a substrate. A polysilicon layer is formed on the thin dielectric layer. A solid-state p-type dopant source is formed and patterned on the polysilicon layer. The patterning exposes regions of the polysilicon layer between a plurality of regions of the solid-state p-type dopant source. The substrate is loaded in a reaction chamber and, without removing the substrate from the reaction chamber, an n-type dopant source layer is formed over the exposed regions of the polysilicon layer and over the plurality of regions of the solid-state p-type dopant source. Further, dopants are at least partially driven from the n-type dopant source layer into the exposed regions of the polysilicon layer to form a plurality of n-type dopant-containing polysilicon regions between the plurality of regions of the solid-state p-type dopant source. The substrate is removed from the reaction chamber. Subsequently, the substrate is heated to provide a plurality of n-type doped polysilicon regions among a plurality of p-type doped polysilicon regions.

The formation of contacts for a back-contact solar cell may be performed using laser ablation to form holes or openings through an anti-reflective coating (ARC) layer formed above an array of p-type and n-type doped regions on the back-side of the solar cell. Conductive contacts, such as metal contacts, may then be formed in the openings to provide electrical coupling with the array of p-type and n-type doped regions. However, in order to facilitate a rapid and reliable laser ablation process, it may be desirable to ensure that the total dielectric thickness over the p-type and n-type doped regions is thin and relatively the same over both the p-type and n-type doped regions. The total dielectric thickness may include the thickness of the ARC layer plus any other dielectric layers formed above the p-type and n-type doped regions, such as solid-state dopant source films like borosilicate glass (BSG) and, if used, phosphosilicate glass (PSG).

In accordance with an embodiment of the present invention, a doping operation for n-type doped regions using a PSG solid-state dopant source is replaced with a $POCl_3$ deposition operation to form, upon mixing with $O_2$, a layer of $P_2O_5$. This modification in doping operation may reduce the total number of process operations required to form an array of p-type and n-type doped regions and may aid in optimizing the drive for ensuring that the total dielectric thickness over p-type and the n-type doped regions is thin and relatively the same over both the p-type and n-type doped regions. Furthermore, in one embodiment, a doping source deposition and at least partial drive is performed in a single chamber of a process tool, with only a single introduction into the process chamber.

FIG. 1 illustrates a flowchart 100 representing operations in a methods of forming contacts for a back-contact solar cell, in accordance with an embodiment of the present invention. FIGS. 2A-2L illustrate cross-sectional views of various stages in the fabrication of a back-contact solar cell, corresponding to operations of flowchart 100, in accordance with an embodiment of the present invention.

Figure 2A:
FIG. 2A illustrates a cross-sectional view of a stage in the fabrication of a back-contact solar cell, corresponding to operation 102 of the flowchart of FIG. 1 and to operation 302 of the flowchart of FIG. 3, in accordance with an embodiment of the present invention.

Referring to operation 102 of flowchart 100, and to corresponding FIG. 2A, a method of forming contacts for a back-contact solar cell includes forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk single-crystal substrate, such as an n-type doped single crystalline silicon substrate. However, in an alternative embodiment, substrate 200 includes a polycrystalline silicon layer disposed on a global solar cell substrate.

Figure 2B:
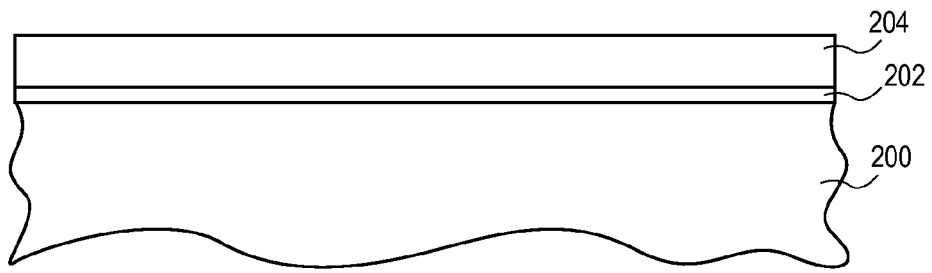
FIG. 2B illustrates a cross-sectional view of a stage in the fabrication of a back-contact solar cell, corresponding to operation 104 of the flowchart of FIG. 1 and to operation 304 of the flowchart of FIG. 3, in accordance with an embodiment of the present invention.

Referring to operation 104 of flowchart 100, and to corresponding FIG. 2B, the method of forming contacts for the back-contact solar cell also includes forming a polysilicon layer 204 on the thin dielectric layer 202. It is to be understood that use of the term polysilicon layer is intended to also cover material that can be described as amorphous- or α-silicon.

Figure 2C:
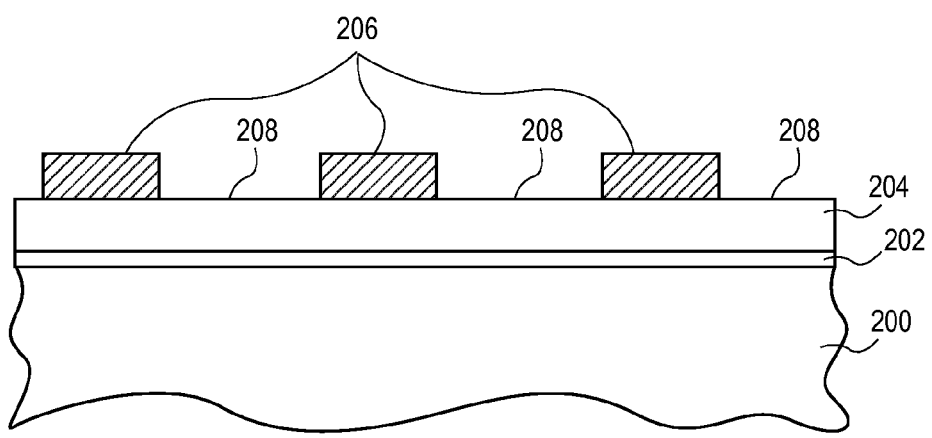
FIG. 2C illustrates a cross-sectional view of a stage in the fabrication of a back-contact solar cell, corresponding to operation 106 of the flowchart of FIG. 1 and to operation 306 of the flowchart of FIG. 3, in accordance with an embodiment of the present invention.

Referring to operation 106 of flowchart 100, and to corresponding FIG. 2C, the method of forming contacts for the back-contact solar cell also includes forming and patterning a solid-state p-type dopant source 206 on the polysilicon layer 204.

In an embodiment, the patterning exposes regions 208 of the polysilicon layer 204 between a plurality of regions 206 of the solid-state p-type dopant source, as depicted in FIG. 2C. In one embodiment, forming and patterning the solid-state p-type dopant source 206 includes forming and patterning a layer of boron silicate glass (BSG). In a specific embodiment, the BSG layer is formed as a uniform, blanket layer and then patterned by a lithography and etch process. In another specific embodiment, the BSG layer is deposited already having a pattern and, thus, the forming and patterning are performed simultaneously. In one such embodiment, the patterned BSG layer is formed by an ink-jet printing approach or a screen-printing approach. It is to be understood that a solid-state p-type dopant source is a layer of film that includes dopant impurity atoms and can be deposited above a substrate. This is in contrast to an ion implantation approach.

Figure 2D:
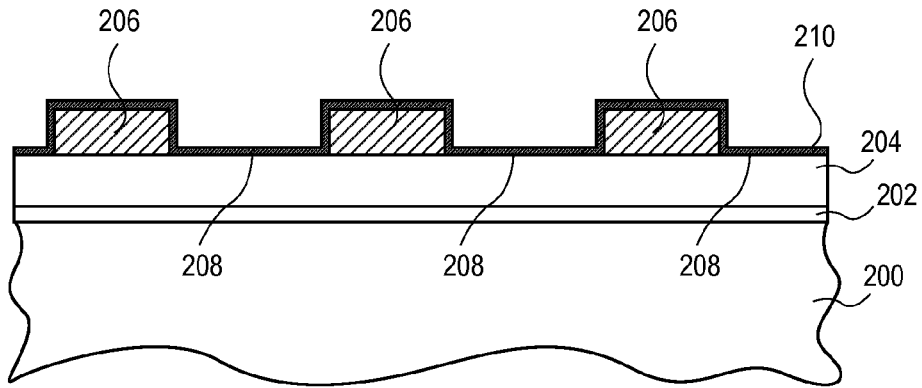
FIG. 2D illustrates a cross-sectional view of a stage in the fabrication of a back-contact solar cell, corresponding to operation 108 of the flowchart of FIG. 1 and to operation 308 of the flowchart of FIG. 3, in accordance with an embodiment of the present invention.

Referring to operation 108 of flowchart 100, and to corresponding FIG. 2D, the method of forming contacts for the back-contact solar cell also includes forming an n-type dopant source layer 210 over the exposed regions 208 of the polysilicon layer 204 and over the plurality of regions 206 of the solid-state p-type dopant source.

Figure 2E:
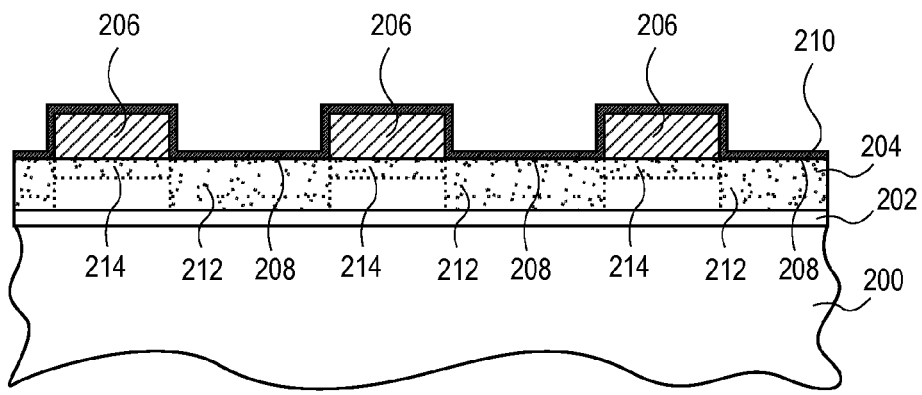
FIG. 2E illustrates a cross-sectional view of a stage in the fabrication of a back-contact solar cell, corresponding to operations 308 and 310 of the flowchart of FIG. 3, in accordance with an embodiment of the present invention.

In an embodiment, referring to FIG. 2E, the forming includes at least partially driving dopants from the n-type dopant source layer 210 into the exposed regions 208 of the polysilicon layer 204 to form a plurality of n-type dopant-containing polysilicon regions 212 between the plurality of regions 206 of the solid-state p-type dopant source. In an embodiment, referring again to FIG. 2E, forming the n-type dopant source layer 210 further includes at least partially driving dopants from the plurality of regions 206 of the solid-state p-type dopant source into the polysilicon layer 204 to form regions 214. In an embodiment, forming the n-type dopant source layer includes forming a layer of $P_2O_5$. Subsequently, the n-type dopant source layer 210 may be removed, as depicted in FIG. 2F.

Figure 2F:
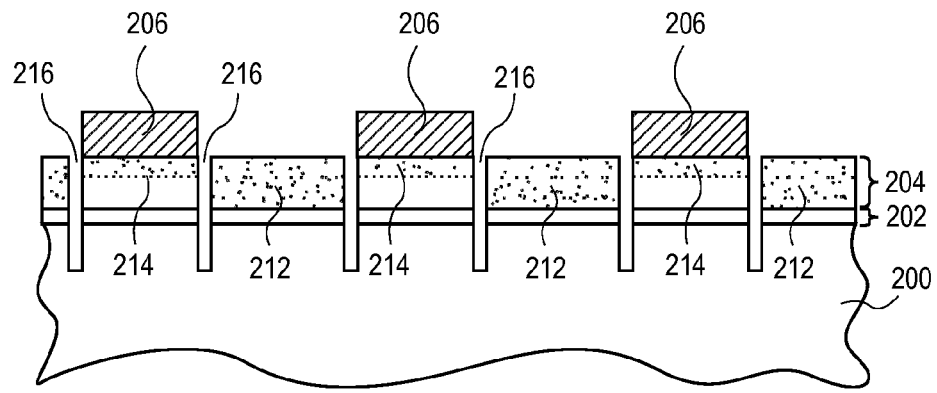
FIG. 2F illustrates a cross-sectional view of a stage in the fabrication of a back-contact solar cell, corresponding to operation 110 of the flowchart of FIG. 1 and to operation 314 of the flowchart of FIG. 3, in accordance with an embodiment of the present invention.

Referring to operation 110 of flowchart 100, and to corresponding FIG. 2F, in one embodiment the method of forming contacts for the back-contact solar cell optionally further includes forming trenches 216 between the plurality of n-type dopant-containing polysilicon regions 212 and the plurality of regions 206 of the solid-state p-type dopant source and corresponding regions 214.

In an embodiment, the trenches 216 are formed in the polysilicon layer 204, in the thin dielectric layer 202, and partially in the substrate 202. In one embodiment, the trenches 216 are formed by using a lithography and etch process. In a specific embodiment, different etch operations are used to pattern polysilicon layer 204 and then substrate 200.

Figure 2G:
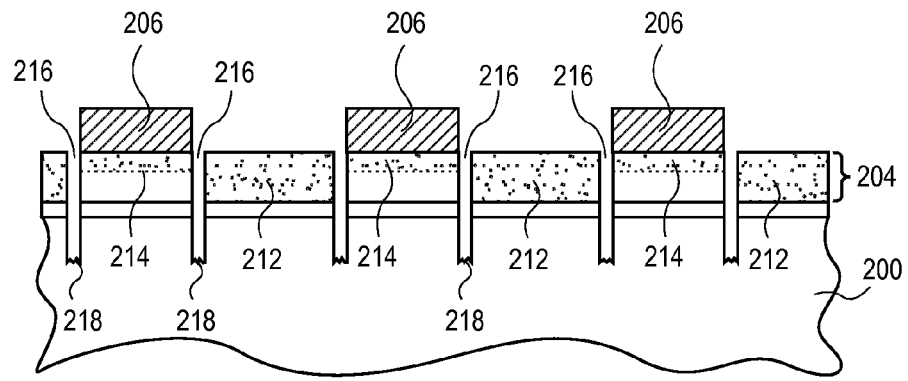
FIG. 2G illustrates a cross-sectional view of a stage in the fabrication of a back-contact solar cell, corresponding to operation 112 of the flowchart of FIG. 1 and to operation 316 of the flowchart of FIG. 3, in accordance with an embodiment of the present invention.

Referring to operation 112 of flowchart 100, and to corresponding FIG. 2G, in one embodiment the method of forming contacts for the back-contact solar cell optionally further includes, subsequent to forming the trenches 216, texturizing portions 218 of the substrate 200 exposed by the trenches 216.

In an embodiment, the texturing provides a random texture pattern. The random texturing pattern may be formed by applying an anisotropic etching process to exposed regions of substrate 200 and may thus be determined by crystal planes, such single-crystalline silicon planes, of the substrate 200. In an embodiment, the forming of the trenches 216 and the texturizing of substrate 200 are performed without performing a cure operation between forming the trenches 216 and texturizing the substrate 200. Such a cure operation may include a heating operation, exposure to infra-red (IR) radiation, or exposure to ultra-violet (UV) radiation.

Figure 2H:
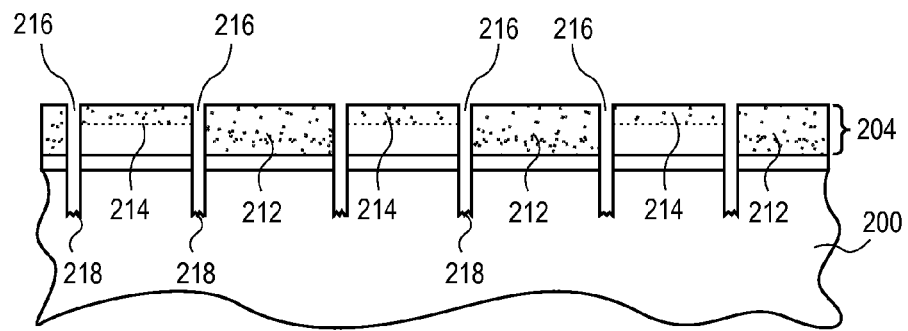
FIG. 2H illustrates a cross-sectional view of a stage in the fabrication of a back-contact solar cell, corresponding to operation 114 of the flowchart of FIG. 1 and to operation 318 of the flowchart of FIG. 3, in accordance with an embodiment of the present invention.

Referring to operation 114 of flowchart 100, and to corresponding FIG. 2H, in one embodiment the method of forming contacts for the back-contact solar cell optionally further includes removing the plurality of regions 206 of the solid-state p-type dopant source. In an embodiment, the plurality of regions 206 of the solid-state p-type dopant source are removed by using a wet etch technique by applying a wet solution including aqueous hydrofluoric acid or another source of HF. In an embodiment, the plurality of regions 206 of the solid-state p-type dopant source are removed by plasma etching.

Figure 2I:
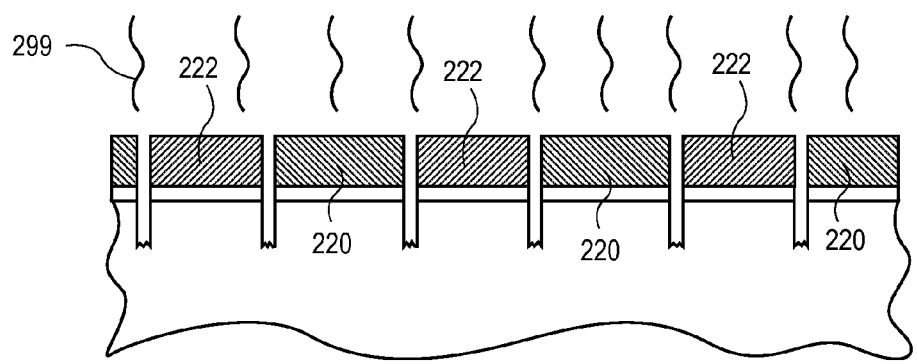
FIG. 2I illustrates a cross-sectional view of a stage in the fabrication of a back-contact solar cell, corresponding to operation 116 of the flowchart of FIG. 1 and to operation 320 of the flowchart of FIG. 3, in accordance with an embodiment of the present invention.

Referring to operation 116 of flowchart 100, and to corresponding FIG. 2I, the method of forming contacts for the back-contact solar cell also includes heating 299 the substrate 200 to provide a plurality of n-type doped polysilicon regions 220 among a plurality of p-type doped polysilicon regions 222.

In an embodiment, heating the substrate 200 includes activating the dopants in the plurality of n-type dopant-containing polysilicon regions 212 to form the plurality of n-type doped polysilicon regions 220. In one embodiment, the activating includes changing the incorporation of at least some of the dopants from interstitial to substitutional within polysilicon layer 204. In a specific embodiment, the activating includes providing the plurality of n-type doped polysilicon regions 220 with a low sheet resistance approximately in the range of 50-300 ohms per square.

In an embodiment, heating the substrate 200 also includes furthering the driving of dopants originating from the plurality of regions 206 of the solid-state p-type dopant source into the polysilicon layer 204, and activating the dopants in the polysilicon layer 204 to provide the plurality of p-type doped polysilicon regions 222. In one embodiment, the activating includes changing the incorporation of at least some of the dopants from interstitial to substitutional within polysilicon layer 204. In a specific embodiment, the activating includes providing the plurality of p-type doped polysilicon regions 222 with a low sheet resistance approximately in the range of 50-300 ohms per square.

Figure 2J:
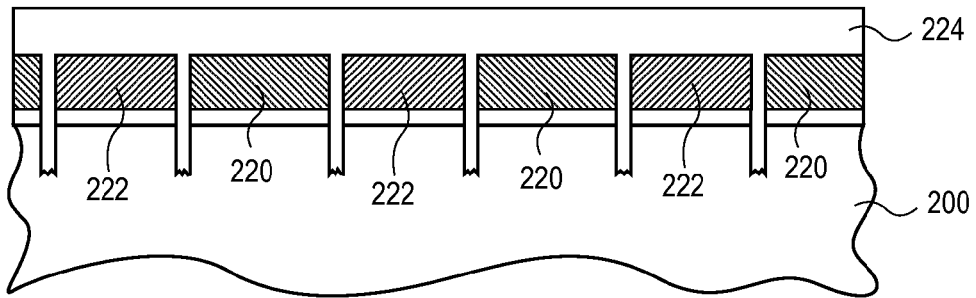
FIG. 2J illustrates a cross-sectional view of a stage in the fabrication of a back-contact solar cell, in accordance with an embodiment of the present invention.

Referring to FIG. 2J, in an embodiment, the method of forming contacts for the back-contact solar cell optionally further includes forming a dielectric layer 224 above the plurality of n-type doped polysilicon regions 220, the plurality of p-type doped polysilicon regions 222, and the exposed portions of substrate 200. In one embodiment, a lower surface of the dielectric layer 224 is formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 2J. In a specific embodiment, the dielectric layer 224 is an anti-reflective coating (ARC) layer.

Figure 2K:
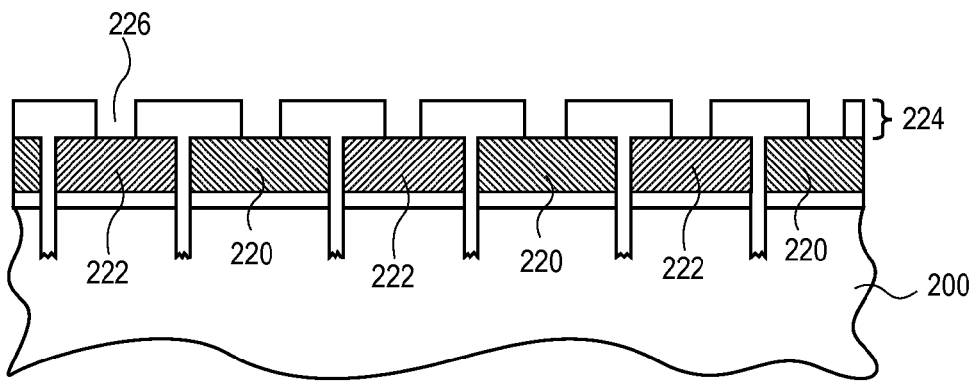
FIG. 2K illustrates a cross-sectional view of a stage in the fabrication of a back-contact solar cell, corresponding to operation 118 of the flowchart of FIG. 1 and to operation 322 of the flowchart of FIG. 3, in accordance with an embodiment of the present invention.

Referring to operation 118 of flowchart 100, and to corresponding FIG. 2K, in an embodiment the method of forming contacts for the back-contact solar cell optionally further includes forming, by laser abalation, a plurality of contact openings 226 to the plurality of n-type doped polysilicon regions 220 and to the plurality of p-type doped polysilicon regions 222. In one embodiment, the contact openings 226 to the n-type doped polysilicon regions 220 have substantially the same height as the contact openings to the p-type doped polysilicon regions 222, as depicted in FIG. 2K.

Figure 2L:
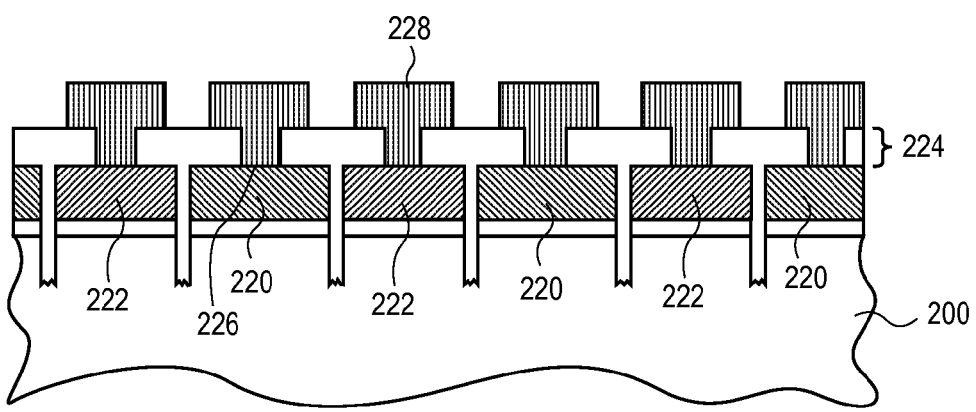
FIG. 2L illustrates a cross-sectional view of a stage in the fabrication of a back-contact solar cell, in accordance with an embodiment of the present invention.

Referring to FIG. 2L, in an embodiment, the method of forming contacts for the back-contact solar cell optionally further includes forming conductive contacts 228 in the plurality of contact openings 226 and coupled to the plurality of n-type doped polysilicon regions 220 and to the plurality of p-type doped polysilicon regions 222. In an embodiment, the conductive contacts 228 are composed of metal and are formed by a deposition, lithographic, and etch approach.

Figure 3:
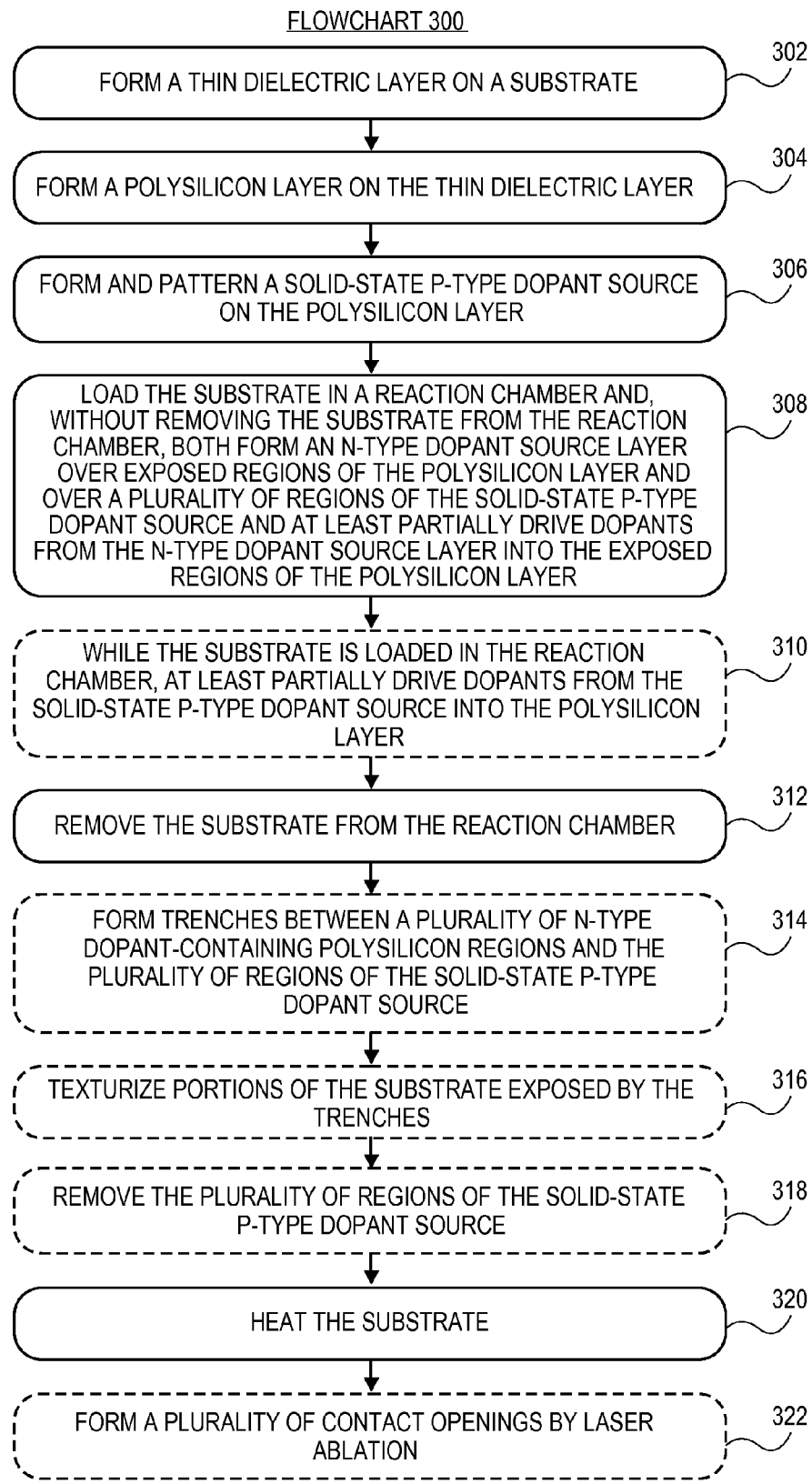
FIG. 3 illustrates a flowchart representing operations in a method of forming contacts for a back-contact solar cell, in accordance with an embodiment of the present invention.

In another aspect of the present invention, an n-type dopant source is formed above a polysilicon layer and a p-type dopant source, and then n-type and p-type dopants are driven into the polysilicon layer, without ever removing a corresponding underlying substrate from a reaction chamber. For example, FIG. 3 illustrates a flowchart 300 representing operations in a methods of forming contacts for a back-contact solar cell, in accordance with an embodiment of the present invention. FIGS. 2A-2L illustrate cross-sectional views of various stages in the fabrication of a back-contact solar cell, corresponding to operations of flowchart 300, in accordance with an embodiment of the present invention.

Referring to operation 302 of flowchart 300, and to corresponding FIG. 2A, a method of forming contacts for a back-contact solar cell includes forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk single-crystal substrate, such as an n-type doped single crystalline silicon substrate. However, in an alternative embodiment, substrate 200 includes a polycrystalline silicon layer disposed on a global solar cell substrate.

Referring to operation 304 of flowchart 300, and to corresponding FIG. 2B, the method of forming contacts for the back-contact solar cell also includes forming a polysilicon layer 204 on the thin dielectric layer 202. It is to be understood that use of the term polysilicon layer is intended to also cover material that can be described as amorphous- or α-silicon.

In an embodiment, the patterning exposes regions 208 of the polysilicon layer 204 between a plurality of regions 206 of the solid-state p-type dopant source, as depicted in FIG. 2C. In one embodiment, forming and patterning the solid-state p-type dopant source 206 includes forming and patterning a layer of boron silicate glass (BSG). In a specific embodiment, the BSG layer is formed as a uniform, blanket layer and then patterned by a lithography and etch process. In another specific embodiment, the BSG layer is deposited already having a pattern and, thus, the forming and patterning are performed simultaneously. In one such embodiment, the patterned BSG layer is formed by an ink-jet printing approach or a screen-printing approach. It is to be understood that a solid-state p-type dopant source is a layer of film that includes dopant impurity atoms and can be deposited above a substrate. This is in contrast to an ion implantation approach.

Referring to operation 308 of flowchart 300, and to corresponding FIGS. 2D and 2E, the method of forming contacts for the back-contact solar cell also includes loading the substrate 200 in a reaction chamber. Without removing the substrate 200 from the reaction chamber, an n-type dopant source layer 210 is formed over the exposed regions 208 of the polysilicon layer 204 and over the plurality of regions 206 of the solid-state p-type dopant source. Dopants from the n-type dopant source layer 210 are at least partially driving into the exposed regions 208 of the polysilicon layer 204 to form a plurality of n-type dopant-containing polysilicon regions 212 between the plurality of regions 206 of the solid-state p-type dopant source.

In an embodiment, referring again to FIG. 2E, forming the n-type dopant source layer 210 further includes at least partially driving dopants from the plurality of regions 206 of the solid-state p-type dopant source into the polysilicon layer 204 to form regions 214. In an embodiment, forming the n-type dopant source layer includes forming a layer of $P_2O_5$. It is noted that it may be the case that driving (or driving to a further extent) dopants from the plurality of regions 206 of the solid-state p-type dopant source into the polysilicon layer 204 to form regions 214 requires an additional operation in the process chamber in addition to only the formation of n-type dopant source layer 210. For example, in an embodiment referring to optional operation 310 of flowchart 300, the method further includes a separate operation wherein, while the substrate 200 is still loaded in the reaction chamber, dopants from the solid-state p-type dopant source are at least partially driven into the polysilicon layer 204 to form, or to further formation of, regions 214. In an embodiment, operation 310 involves heating the substrate 200 well above the temperature of the operation described in association with operation 308.

Referring to operation 312 of flowchart 300, the method of forming contacts for the back-contact solar cell also includes, subsequent to the above process operations have been performed in a single introduction of substrate 200 into the reaction chamber, removing the substrate 200 from the reaction chamber. Subsequently, the n-type dopant source layer 210 may be removed, as depicted in FIG. 2F.

Referring to operation 314 of flowchart 300, and to corresponding FIG. 2F, in one embodiment the method of forming contacts for the back-contact solar cell optionally further includes forming trenches 216 between the plurality of n-type dopant-containing polysilicon regions 212 and the plurality of regions 206 of the solid-state p-type dopant source and corresponding regions 214.

In an embodiment, the trenches 216 are formed in the polysilicon layer 204, in the thin dielectric layer 202, and partially in the substrate 202. In one embodiment, the trenches 216 are formed by using a lithography and etch process. In a specific embodiment, different etch operations are used to pattern polysilicon layer 204 and then substrate 200.

Referring to operation 316 of flowchart 300, and to corresponding FIG. 2G, in one embodiment the method of forming contacts for the back-contact solar cell optionally further includes, subsequent to forming the trenches 216, texturizing portions 218 of the substrate 200 exposed by the trenches 216.

In an embodiment, the texturing provides a random texture pattern. The random texturing pattern may be formed by applying an anisotropic etching process to exposed regions of substrate 200 and may thus be determined by crystal planes, such single-crystalline silicon planes, of the substrate 200. In an embodiment, the forming of the trenches 216 and the texturizing of substrate 200 are performed without performing a cure operation between forming the trenches 216 and texturizing the substrate 200. Such a cure operation may include a heating operation, exposure to infra-red (IR) radiation, or exposure to ultra-violet (UV) radiation.

Referring to operation 318 of flowchart 300, and to corresponding FIG. 2H, in one embodiment the method of forming contacts for the back-contact solar cell optionally further includes removing the plurality of regions 206 of the solid-state p-type dopant source. In an embodiment, the plurality of regions 206 of the solid-state p-type dopant source are removed by using a wet etch technique by applying a wet solution including aqueous hydrofluoric acid or another source of HF. In an embodiment, the plurality of regions 206 of the solid-state p-type dopant source are removed by plasma etching.

Referring to operation 320 of flowchart 300, and to corresponding FIG. 2I, the method of forming contacts for the back-contact solar cell also includes heating 299 the substrate 200 to provide a plurality of n-type doped polysilicon regions 220 among a plurality of p-type doped polysilicon regions 222.

In an embodiment, heating the substrate 200 includes activating the dopants in the plurality of n-type dopant-containing polysilicon regions 212 to form the plurality of n-type doped polysilicon regions 220. In one embodiment, the activating includes changing the incorporation of at least some of the dopants from interstitial to substitutional within polysilicon layer 204. In a specific embodiment, the activating includes providing the plurality of n-type doped polysilicon regions 220 with a low sheet resistance approximately in the range of 50-300 ohms per square.

In an embodiment, heating the substrate 200 also includes furthering the driving of dopants originating from the plurality of regions 206 of the solid-state p-type dopant source into the polysilicon layer 204, and activating the dopants in the polysilicon layer 204 to provide the plurality of p-type doped polysilicon regions 222. In one embodiment, the activating includes changing the incorporation of at least some of the dopants from interstitial to substitutional within polysilicon layer 204. In a specific embodiment, the activating includes providing the plurality of p-type doped polysilicon regions 222 with a low sheet resistance approximately in the range of 50-300 ohms per square.

Referring to FIG. 2J, in an embodiment, the method of forming contacts for the back-contact solar cell optionally further includes forming a dielectric layer 224 above the plurality of n-type doped polysilicon regions 220, the plurality of p-type doped polysilicon regions 222, and the exposed portions of substrate 200. In one embodiment, a lower surface of the dielectric layer 224 is formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 2J. In a specific embodiment, the dielectric layer 224 is an anti-reflective coating (ARC) layer.

Referring to operation 322 of flowchart 300, and to corresponding FIG. 2K, in an embodiment the method of forming contacts for the back-contact solar cell optionally further includes forming, by laser ablation, a plurality of contact openings 226 to the plurality of n-type doped polysilicon regions 220 and to the plurality of p-type doped polysilicon regions 222. In one embodiment, the contact openings 226 to the n-type doped polysilicon regions 220 have substantially the same height as the contact openings to the p-type doped polysilicon regions 222, as depicted in FIG. 2K.

Referring to FIG. 2L, in an embodiment, the method of forming contacts for the back-contact solar cell optionally further includes forming conductive contacts 228 in the plurality of contact openings 226 and coupled to the plurality of n-type doped polysilicon regions 220 and to the plurality of p-type doped polysilicon regions 222. In an embodiment, the conductive contacts 228 are composed of metal and are formed by a deposition, lithographic, and etch approach.

Thus, methods of forming contacts for back-contact solar cells have been disclosed. In accordance with an embodiment of the present invention, a method includes forming a thin dielectric layer on a substrate. The method also includes forming a polysilicon layer on the thin dielectric layer. The method also includes forming and patterning a solid-state p-type dopant source on the polysilicon layer, the patterning exposing regions of the polysilicon layer between a plurality of regions of the solid-state p-type dopant source. The method also includes forming an n-type dopant source layer over the exposed regions of the polysilicon layer and the plurality of regions of the solid-state p-type dopant source, the forming comprising at least partially driving dopants from the n-type dopant source layer into the exposed regions of the polysilicon layer to form a plurality of n-type dopant-containing polysilicon regions between the plurality of regions of the solid-state p-type dopant source. The method also includes heating the substrate to provide a plurality of n-type doped polysilicon regions among a plurality of p-type doped polysilicon regions. In one embodiment, the method also includes, subsequent to forming an n-type dopant source layer and prior to heating the substrate, forming trenches between the plurality of n-type dopant-containing polysilicon regions and the plurality of regions of the solid-state p-type dopant source, the trenches formed in the polysilicon layer, in the thin dielectric layer, and partially in the substrate.

What is claimed is:

1. A method of forming contacts for a solar cell, the method comprising:
   forming a dielectric layer on a substrate;
   forming a silicon layer over the dielectric layer;
   forming a solid-state p-type dopant source on the silicon layer;
   patterning the solid-state p-type dopant source, the patterning exposing regions of the silicon layer between the plurality of regions of the solid-state p-type dopant source;
   forming an n-type dopant source layer over the exposed regions of the silicon layer and the plurality of regions of the solid-state p-type dopant source;
   forming a plurality of n-type dopant-containing silicon regions between the plurality of regions of the solid-state p-type dopant source; and
   forming trenches in the plurality of n-type dopant-containing silicon regions and partially in the substrate, wherein the trenches are formed between the plurality of n-type dopant-containing silicon regions and the plurality of regions of the solid-state p-type dopant source; and
   heating the substrate to provide a plurality of n-type doped silicon regions among a plurality of p-type doped silicon regions.

2. The method of claim 1, further comprising before to the heating:
   removing the plurality of regions of the solid-state p-type dopant source.

3. The method of claim 2, wherein removing the plurality of regions of the solid-state p-type dopant source comprises performing a wet etch technique.

4. The method of claim 2, wherein removing the plurality of regions of the solid-state p-type dopant source comprises applying an aqueous hydrofluoric (HF) acid or aqueous hydrofluoric (HF) acid derivative.

5. The method of claim 1, further comprising:
   subsequent to forming the trenches, texturizing portions of the substrate exposed by the trenches.

6. The method of claim 5, wherein forming the trenches and the texturizing is performed without a cure operation between the forming the trenches and the texturizing.

7. The method of claim 1, wherein forming the n-type dopant source layer further comprises at least partially driving dopants from the plurality of regions of the solid-state p-type dopant source into the silicon layer.

8. A solar cell fabricated according to the method of claim 1.

9. A method of forming contacts for a solar cell, the method comprising:
   forming a tunnel oxide layer over a substrate;
   forming a polysilicon layer over the tunnel oxide layer;
   forming a solid-state p-type dopant source on the polysilicon layer;
   patterning the solid-state p-type dopant source,
   forming an n-type dopant source layer over the exposed regions of the polysilicon layer and the plurality of regions of the solid-state p-type dopant source;
   forming a plurality of n-type dopant-containing polysilicon regions between the plurality of regions of the solid-state p-type dopant source; and
   forming trenches in the plurality of n-type dopant-containing polysilicon regions and partially in the substrate, wherein the trenches are formed between the plurality of n-type dopant-containing polysilicon regions and the plurality of regions of the solid-state p-type dopant source; and
   heating the substrate to provide a plurality of n-type doped polysilicon regions among a plurality of p-type doped polysilicon regions; and, subsequent to heating, forming conductive contacts coupled to the plurality of n-type dopant-containing silicon regions and the p-type dopant-containing silicon regions.

10. The method of claim 9, further comprising before to the heating:
    removing the plurality of regions of the solid-state p-type dopant source.

11. The method of claim 10, wherein removing the plurality of regions of the solid-state p-type dopant source comprises performing a wet etch technique.

12. The method of claim 10, wherein removing the plurality of regions of the solid-state p-type dopant source comprises applying an aqueous hydrofluoric (HF) acid or aqueous hydrofluoric (HF) acid derivative.

13. The method of claim 9, further comprising:
    subsequent to forming the trenches, texturizing portions of the substrate exposed by the trenches.

14. The method of claim 13, wherein forming the trenches and the texturizing is performed without a cure operation between the forming the trenches and the texturizing.

15. The method of claim 9, wherein forming the n-type dopant source layer further comprises at least partially driving dopants from the plurality of regions of the solid-state p-type dopant source into the polysilicon layer.

16. A solar cell fabricated according to the method of claim 9.

* * * * *